(12) United States Patent
Sanchez

(10) Patent No.: US 7,838,431 B2
(45) Date of Patent: Nov. 23, 2010

(54) METHOD FOR SURFACE TREATMENT OF SEMICONDUCTOR SUBSTRATES

(75) Inventor: Errol Sanchez, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 182 days.

(21) Appl. No.: 12/143,606

(22) Filed: Jun. 20, 2008

(65) Prior Publication Data

US 2009/0311850 A1    Dec. 17, 2009

Related U.S. Application Data

(60) Provisional application No. 61/061,602, filed on Jun. 14, 2008.

(51) Int. Cl.
*H01L 21/00* (2006.01)

(52) U.S. Cl. .................. 438/706; 438/705; 438/726; 438/743; 438/762; 438/795; 257/E21.104; 257/E21.224; 257/E21.228; 257/E21.347; 257/E21.485

(58) Field of Classification Search .......... 438/705, 438/726–762, 795, 906; 257/257, E21.102, 257/224–228, 347, 485

See application file for complete search history.

(56) References Cited

U.S. PATENT DOCUMENTS

| | | | |
|---|---|---|---|
| 4,316,074 A * | 2/1982 | Daly | 219/121.6 |
| 4,940,505 A * | 7/1990 | Schachameyer et al. | 117/97 |
| 5,151,135 A * | 9/1992 | Magee et al. | 134/1 |
| 6,675,057 B2 * | 1/2004 | Liu | 700/117 |
| 6,689,645 B2 * | 2/2004 | Houng et al. | 438/143 |
| 6,712,078 B2 * | 3/2004 | Park et al. | 134/1.3 |
| 6,805,751 B2 | 10/2004 | Allen | |
| 6,881,687 B1 * | 4/2005 | Castrucci | 438/795 |
| 7,078,651 B2 | 7/2006 | Jennings | |
| 7,237,561 B2 * | 7/2007 | Park et al. | 134/1.3 |
| 7,588,974 B2 * | 9/2009 | Miyanaga et al. | 438/158 |
| 2006/0292808 A1 | 12/2006 | Autryve et al. | |
| 2007/0032004 A1 | 2/2007 | Ramaswamy et al. | |

FOREIGN PATENT DOCUMENTS

| EP | 0 400 651 A2 | 12/1990 |
|---|---|---|
| WO | WO 00/22661 A1 | 4/2000 |

OTHER PUBLICATIONS

International Search Report and Written Opinion mailed Jan. 21, 2010 for PCT Application No. PCT/US2009/047038.

* cited by examiner

*Primary Examiner*—Michael S Lebentritt
(74) *Attorney, Agent, or Firm*—Moser IP Law Group

(57) ABSTRACT

Methods and apparatus for processing a substrate are provided herein. In some embodiments, a method of processing a substrate may include providing a substrate having at least one of a defect or a contaminant disposed on or near a surface of the substrate; and selectively annealing a portion of the substrate with a laser beam in the presence of a process gas comprising hydrogen. The laser beam may be moved over the substrate or continuously, or in a stepwise fashion. The laser beam may be applied in a continuous wave or pulsed mode. The process gas may further comprise an inert gas, such as, at least one of helium, argon, or nitrogen. A layer of material may be subsequently deposited atop the annealed substrate.

24 Claims, 5 Drawing Sheets

METHOD FOR SURFACE TREATMENT OF SEMICONDUCTOR SUBSTRATES

CROSS-REFERENCE TO RELATED APPLICATIONS

This application claims benefit of U.S. provisional patent application Ser. No. 61/061,602, filed Jun. 14, 2008, which is herein incorporated by reference.

BACKGROUND OF THE INVENTION

1. Field of the Invention

Embodiments of the present invention generally relate to the field of semiconductor manufacturing processes and devices, and more particularly, to methods of surface treatment of semiconductor substrates prior to layer deposition.

2. Description of the Related Art

Semiconductor devices, such as microprocessors and memory chips, are manufactured by creating multiple layers of various materials on the top surface of a semiconductor substrate (for example, a silicon substrate). As an illustrative example, during the fabrication of CMOS (complementary metal oxide semiconductor) devices, a dielectric layer may be grown atop a silicon substrate to form an insulating layer between the gate electrode and the source/drain/channel region of the device.

If the surface of the substrate has contaminants, or defects, the devices manufactured thereupon may be defective (e.g., the devices may have reduced performance, improper performance, may be inoperative, or the like). Contamination of the substrate surface is a major cause of reduced process yields in device manufacturing. Therefore, it is desirable to keep the surfaces of the substrate free of any contaminants or defects.

Contaminants can come from various sources. Prior processing steps, such as plasma etching, wet chemical etching, or the like, can leave contaminants such as oxygen, carbon, water, various hydrocarbons, and the like on the surface of the substrate. Moreover, these processes can also damage the surface of the substrate thereby further causing defects.

Typically, contaminants and defects on the surface of the substrate may be removed by a high temperature hydrogen bake at temperatures greater than 700 degrees Celsius during a pre-deposition cleaning and surface treatment process of a processed bulk silicon-containing substrate. However, such high-temperature processing of the substrate undesirably leads to diffusion of materials between boundaries of structures formed on the substrate (such as, for example, dopants, introduced into the substrate prior to layer deposition, adjacent disparate materials, and the like). Moreover, as the size of devices continues to shrink, such diffusion problems become increasingly troublesome due to the reduced feature sizes.

Therefore, there is a need for improved techniques for removing contaminants and/or healing defects while limiting material diffusion.

SUMMARY OF THE INVENTION

Methods and apparatus for treating the surface of a semiconductor substrate are provided herein. In some embodiments, a method of treating the surface of a semiconductor substrate may include providing a substrate having at least one of a defect or a contaminant disposed on or near a surface of the substrate; and selectively annealing a portion of the substrate with a laser beam in the presence of a process gas comprising hydrogen. The laser beam may be moved over the substrate continuously or in a stepwise fashion. The laser beam may be applied in a continuous wave or pulsed mode. The process gas may further comprise an inert gas, such as, at least one of helium, argon, or nitrogen. A layer of material may be subsequently deposited atop the annealed substrate.

In some embodiments, a computer readable medium may be provided having instructions stored thereon that, when executed by a processor, causes a semiconductor process tool to perform a method of treating the surface of a semiconductor substrate, including selectively annealing a portion of a substrate having at least one of a defect or a contaminant disposed on or near a surface of the substrate with a laser beam in the presence of a process gas comprising hydrogen. A layer of material may be subsequently deposited atop the annealed substrate.

In some embodiments, an apparatus for processing a semiconductor substrate is provided. The apparatus for processing a semiconductor substrate may include a vacuum transfer chamber having one or more substrate transfer robots disposed therein; a laser annealing chamber coupled to the vacuum transfer chamber, the laser annealing chamber having a gas inlet; a deposition chamber coupled to the vacuum transfer chamber; a load lock chamber coupled to the vacuum process chamber; and a controller for controlling operation of the vacuum process chamber. In some embodiments, the controller may contain instructions that, when executed, causes the tool to perform a method including selectively annealing a portion of a substrate having at least one of a defect or a contaminant disposed on or near a surface of the substrate with a laser beam in the presence of a process gas comprising hydrogen.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

Methods and apparatus for the deposition of a layer on a substrate are provided herein. In some embodiments, the inventive methods may include annealing the substrate with a focused energy source (such as a laser beam). In some embodiments a layer of material may be subsequently deposited atop the annealed substrate. The laser anneal may advantageously remove defects and contaminants proximate the surface of the substrate, while preventing diffusion of materials within the substrate. Embodiments of the present invention may advantageously provide similar benefits to bulk substrate heating (i.e., a hydrogen bake at temperatures greater than 700 degrees Celsius.) without the concomitant disadvantage of material diffusion observed with such conventional techniques.

Figure 1:
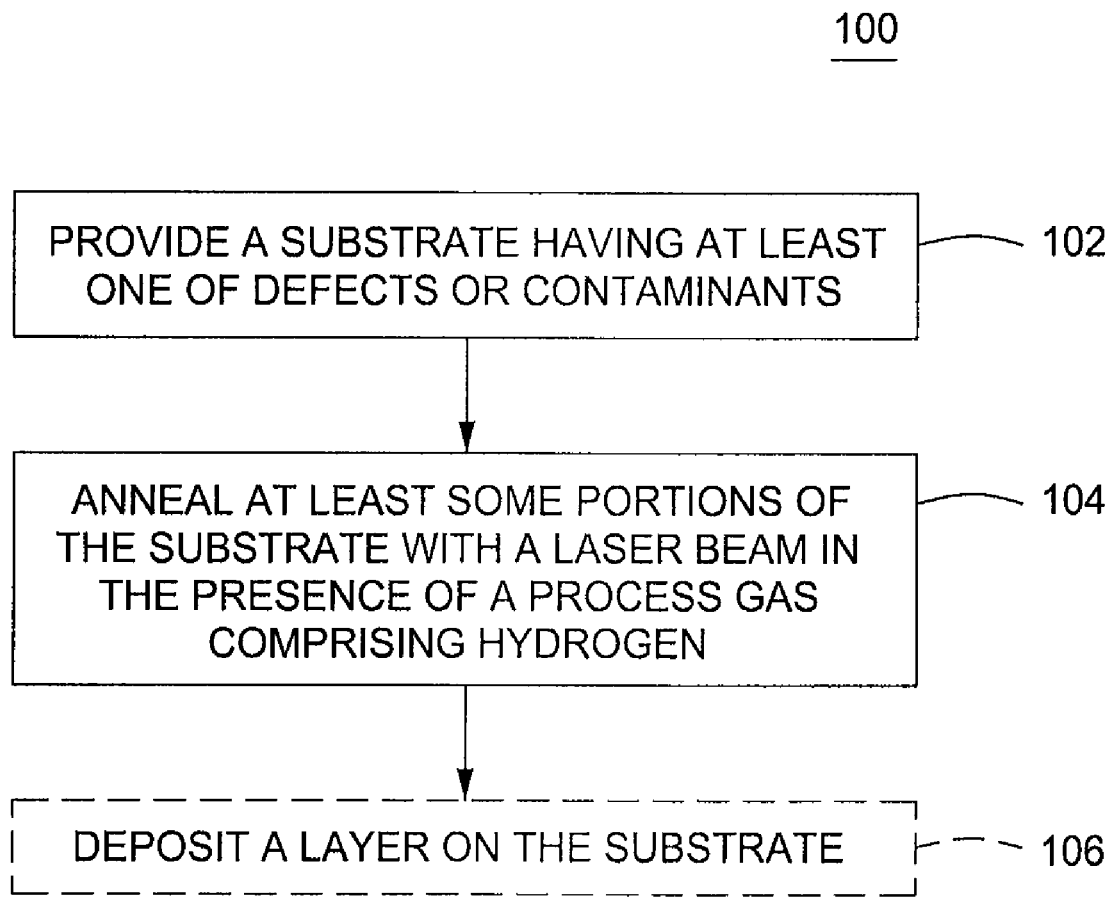
FIG. 1 depicts a flow chart of a method for the deposition of a layer on a substrate in accordance with some embodiments of the present invention.

FIG. 1 depicts a method for the deposition of a layer on a substrate in accordance with some embodiments of the present invention. Embodiments of the method of FIG. 1 are further described with respect to FIGS. 2A-D, which schematically depict stages of fabrication corresponding to the method 100 in accordance with some embodiments of the present invention.

Figure 2A:
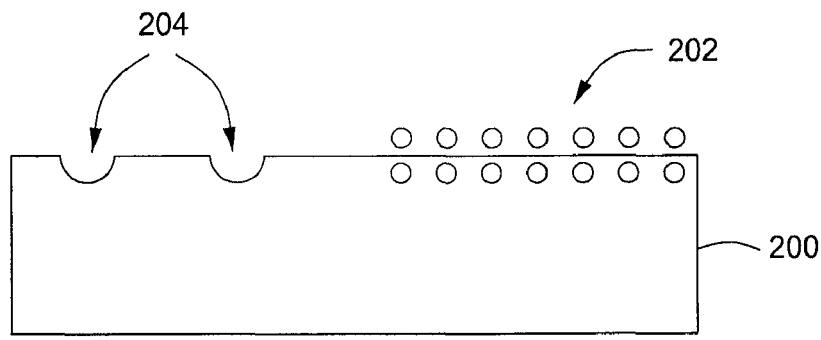
FIGS. 2A-D depict stages of deposition of a layer on a substrate in accordance with some embodiments of the method of FIG. 1.

The method 100 generally begins at 102, where a substrate 200 is provided, as illustrated in FIG. 2A. The substrate 200 may comprise a silicon-containing material, such as silicon, silicon germanium, silicon carbon, p-doped silicon, n-doped silicon, silicon on insulator (SOI), or the like. The substrate 200 may have one or more completely or partially formed semiconductor devices disposed therein and/or thereupon, and may have been processed by one or more methods including ion implantation, plasma etching, wet chemical etching, chemical vapor deposition, plasma enhanced chemical vapor deposition, and the like. As such, the substrate 200 may comprise doped regions (e.g., source/drain regions), features (e.g., vias, trenches, and the like), or metal-containing regions (e.g., metal interconnect regions and the like).

Prior processing by methods described above may damage the substrate 200 near the surface resulting in defects 204 and/or contaminants 202. For example, etchants may create such defects 204 when a mask layer is removed by reacting with the material of the substrate 200. Further, it is contemplated that defects 204 may be defects such as lattice defects, surface roughness, cracks, and the like. The defect 204 may reside on the surface of the substrate and/or on the surface of an feature etched into the substrate 200.

In addition to defects 204, prior processing of the substrate 200 may result in contaminants 202 disposed on or proximate the surface of the substrate 200. Contaminants 202 may be any undesirable material, and, in a non-limiting example, may include at least one of oxygen, carbon, hydrocarbons, water, halides, and the like. For example, in some embodiments, contaminants 202 may include residual material from a layer removal process (for example, a mask layer removal process), or other processing. The contaminants 202 may include mask (or other material) layer residues, etchant residues, other process gas residues, contaminants deposited or formed due to exposure of the substrate to atmosphere (for example, while transferring the substrate between process chambers), and the like. The contaminants 202 may reside on the surface of the substrate 200, proximate (and below) the surface of the substrate 200, on the surface of etched features in the substrate 200, and the like.

Figure 2B:
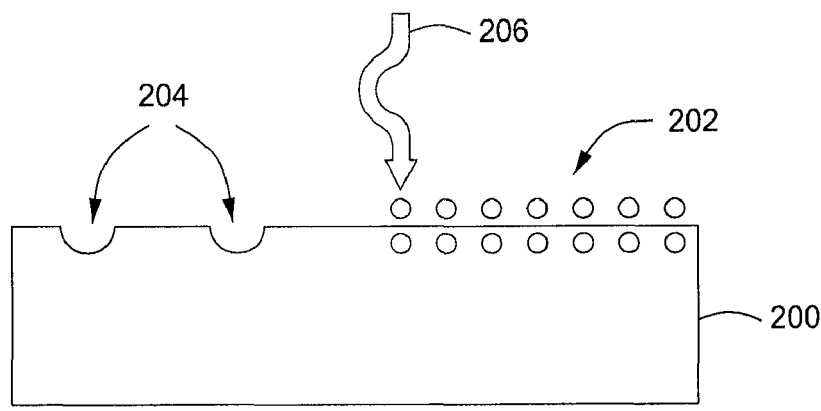
Figure 2C:
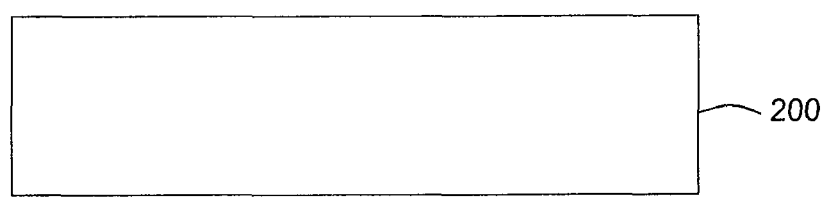

Next, at 104, at least portions of the substrate 200 may be annealed with a laser in the presence of a process gas comprising hydrogen to heal and/or remove the defects 204 and/or contaminants 202 (e.g., the entire surface of the substrate 200 may be annealed or only selected portions of the surface of the substrate 200). The laser anneal process in a hydrogen atmosphere facilitates healing surface defects, for example by localized heating and silicon (Si) migration, and/or removing contaminants, for example by silicon-oxygen (SiO) sublimation and carbon (C) desorption, without the thermal budget issues arising in thermal bake processes. As illustrated in FIG. 2B, the laser anneal comprises scanning at least a portion of the substrate 200 with a beam 206 of radiation emitted by a laser (e.g., a laser beam 206) in the presence of at least one ambient gas. The laser annealing operates to heal and/or remove any defects 204 and/or to remove any contaminants 202 present on or proximate the surface of the substrate 200, as shown in FIG. 2C. The substrate 200 may be laser annealed in a laser annealing chamber as described below with respect to FIG. 3, or other suitable chamber.

In some embodiments, selected portions of the surface or the entire surface of the substrate 200 may be annealed with the laser beam 206 by sequentially scanning the laser beam 206 over the substrate surface. In some embodiments, the scanning may be continuous, for example, the laser beam 206 may traverse the substrate surface without pause at any portion of the surface being annealed. In some embodiments, the rate at which the laser beam is scanned across the surface may be between about 10 mm/sec and about 100 mm/sec. In some embodiments, the scanning may be stepwise, for example, the laser beam 206 may be positioned over a first portion of the substrate surface for a desired first period of time, and then moved to a second portion of the substrate surface and held above the second portion for a desired second period of time. Each successive period of time (e.g., the first period, the second period, and so on) may be the same or different. In some embodiments, the laser beam 206 may irradiate a particular portion of the substrate surface for a time ranging between about 1 msec to about 10 seconds.

The laser beam 206 may be of appropriate dimensions, such that the surface area of the portion of the substrate surface radiated at any instant may be between about 100 $\mu m^2$ to 100 $mm^2$. It is contemplated that the dimensions of the laser beam 206 can be adjusted relative to, for example, the average size of an ion dopant region or other such feature disposed in the substrate 200.

In some embodiments, the laser beam 206 may have a wavelength or a combination of wavelengths ranging from about 150 to about 1100 nanometers. The wavelength of the laser beam 206 may be selected based on the identity and subsequent absorption properties of the substrate 200. For instance, the wavelength can be selected such it is not absorbed strongly by the substrate, thereby limiting significant increases in substrate temperature (either locally proximate the laser beam 206 or universally in the bulk). In some embodiments, the absorption coefficient (also referred to as the extinction coefficient, molecular extinction coefficient, absorption cross section, or the like) of the substrate 200 utilized with the above wavelength range may be between about 20 to about 200 Å. Further, the weakly absorbing nature of the substrate material may limit depth of temperature increase due to irradiation by the laser beam 206 to proximate the substrate surface. In some embodiments, the substrate may be heated to a depth of about 50 Å or less (thereby facilitating annealing to a depth of about 50 Å or less). Further, it is contemplated that the intensity of the laser source may be adjusted to control the temperature or depth of the portion of the substrate being annealed. For example, in some embodiments, multiple passes over the same portion of the substrate at a lower intensity may provide the same depth and effectiveness of treatment, or a deeper total depth of treatment, without increasing the bulk temperature of the substrate.

The laser beam 206 may be supplied in either a continuous or pulsed beam. The beam 206 may be provided either continuously or pulsed during annealing of an entire substrate. Alternatively, in some embodiments, the beam may be provided continuously over some portions of the substrate and pulsed over other portions of the substrate.

In some embodiments, a continuous beam may be selected if the material of the substrate being annealed is weakly absorbing, and thus may require more input radiation to achieve the temperature necessary to heal defects or remove contaminants. In some embodiments, a continuous beam may be selected to rapidly achieve a desired temperature at each portion of the substrate being annealed, such that maximum throughput can be maintained while still maintaining a reduced thermal budget for each substrate and limiting dopant diffusion in each substrate. In some embodiments, a continuous beam may be provided at an intensity or power of between about 10 kW/cm$^2$ to about 100 kW/cm$^2$ In some embodiments, a pulsed beam may be selected if the material of the substrate being annealed is strongly absorbing, and thus may require less input radiation to achieve the temperature necessary to heal defects or remove contaminants. This input radiation may be delivered over a much shorter time period or pulse duration than a time period required for heat to be dispersed over the bulk material. In embodiments where the laser beam 206 is pulsed, each pulse of the laser beam 206 may be provided to a different location on the substrate 200 (e.g., provide pulse then move laser beam to new location), or a plurality of pulses may be provided to a particular location prior to moving the laser beam to a new location over the substrate 200. In some embodiments, the laser beam may return to a particular location of the substrate 200 that has been previously subjected to the laser beam 206 to provide an additional pulse or pulses (for example to allow the substrate to locally cool while still annealing a different portion of the substrate).

The energy delivered by each pulse to a portion of the substrate may be adjusted in accordance with the identity of the substrate material, or the condition thereof, by varying at least one of the laser wavelength, pulse duration, or beam diameter. In some embodiments, the energy delivered by each pulse is between about 20 mJ/cm$^2$ to about 2000 mJ/cm$^2$. In some embodiments, the pulse duration is between about 100 femtosecond to 100 nanosecond. In some embodiments, the beam diameter is between about 10-10000 μm.

Each pulse may include a period during which the beam 206 is on (a first period) and a period during which the beam 206 is off (a second period). The first and second periods together define a total pulse period, or frequency. In some embodiments, a frequency between each pulse (e.g., the time between which consecutive pulses reach the surface of the substrate) may range between about 1 Hz to about 100 Hz. The pulse frequency may be adjusted to control at least one of the temperature or the depth of the portion of the substrate being annealed. In some embodiments, the total number of pulses applied for the treatment may be varied in accordance with initial conditions of the substrate. Initial conditions of the substrate may include, for example, pre-steps or history, defect density, surface roughness, identity and concentration of contaminants, identity of the substrate material, and the like.

In some embodiments, the pulse energy may be varied between pulses applied to the portion of the substrate being anneal. In some embodiments, the pulse energy is varied uniformly between the initial and final pulses applied to the portion of the substrate being annealed. It is further contemplated that the pulse energy can be varied using any suitable profile such as to reduce defect density, reduce surface roughness, remove contaminants, or the like. In one specific embodiment, the pulse energy is varied between the initial and final pulse to reduce roughness of the substrate surface, for example, from a >10 Å RMS roughness to a roughness of about 1 Å RMS or less.

In some embodiments, the portion of the substrate being annealed may reach temperatures ranging between about 700 to about 1000 degrees Celsius. The temperature of the bulk of the substrate 200 (e.g., portions at least 50 Å below the surface) and in portions of the substrate 200 not being radiated by the laser beam 206 may be maintained between about 50 to about 300 degrees Celsius.

The laser anneal described above is performed in the presence of a process gas including hydrogen. In some embodiments, the process gas may further include one or more inert gases, such as helium, nitrogen, argon, or the like.

In some embodiments, the process gas for the laser annealing process may be supplied at a total gas flow from about 100 to 1000 sccm, or, in some embodiments, from about 1000 to 10000 sccm. The process gas may utilize a range of compositions. In one embodiment, the process gas may comprise between about 5 to 100 percent of the hydrogen gas. In one embodiment, the process gas may comprise between about up to about 95 percent of the inert gas. In one specific embodiment, hydrogen is provided at a rate of between about 5000 to 9000 sccm and argon is provided at a rate of between about 1000 to 5000 sccm. In some embodiments, the laser anneal may be performed at an ambient pressure in the annealing chamber ranging from between about 1 Torr to about 700 Torr.

Figure 2D:
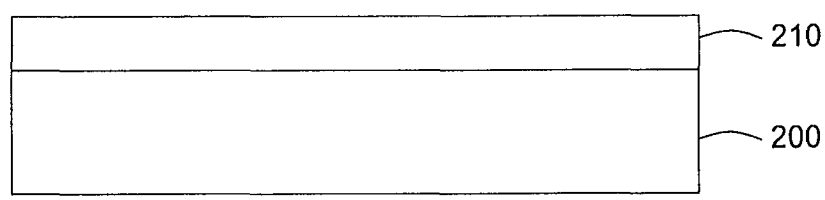

The laser anneal process described above may continue until an entire substrate, or at least portions thereof, are treated to heal any defects 204 or remove any contaminants 202 as desired. Upon completion of the laser anneal of substrate 200, the substrate may be further processed as desired (such as to continue fabrication of a device or devices upon the substrate). For example, in some embodiments, at 106, a layer 210 may be deposited on the substrate 200, as shown in FIG. 2D. The layer 210 may be deposited any suitable method for depositing a layer upon a substrate. Exemplary methods for deposition may include epitaxial growth, chemical vapor deposition, physical vapor deposition, and the like. In some embodiments, the layer 210 may comprise silicon, germanium, carbon and combinations thereof and may be formed by an epitaxial growth process.

The above laser annealing process may be performed on a blank substrate (e.g., a substrate being uniform across the entire surface of the substrate), or on substrate having at least partially formed structures disposed thereon. For example, in some embodiments, the substrate may have a patterned mask layer disposed thereover and exposed features etched into the substrate through the patterned mask layer. A laser anneal as described above may be utilized to selectively anneal the surfaces of the exposed features prior to, for example, metallization or the like. The layer 210 may be similarly be deposited into a feature etched into the substrate 200 such as a via, trench, metal interconnect structure or the like, and is not limited to be disposed on the surface of substrate 200.

The method 100 described above may be performed in any suitable process chambers for laser annealing such as that described below with respect to FIG. 3. In addition, subsequent layers, such as layer 210 may be performed in any suitable process chambers for deposition, such as that described below with respect to FIG. 4. One suitable example of a suitable deposition chamber is the RP EPI® process chamber, available from Applied Materials, Inc. of Santa Clara, Calif. Other suitable layer deposition chambers may be utilized such as chemical vapor deposition chambers, physical vapor deposition chambers, or the like. These process chambers may be utilized individually, or may be part of a cluster tool, such as one of the CENTURA® line of cluster tools, also available from Applied Materials, Inc. Integrating both the laser anneal chamber and the layer deposition chamber on a single platform (e.g., the cluster tool) may advantageously prevent re-contamination of the laser anneal treated substrate during the exchange of the substrate between chambers. An example of a suitable cluster tool is described below with respect to FIG. 5.

Figure 3:
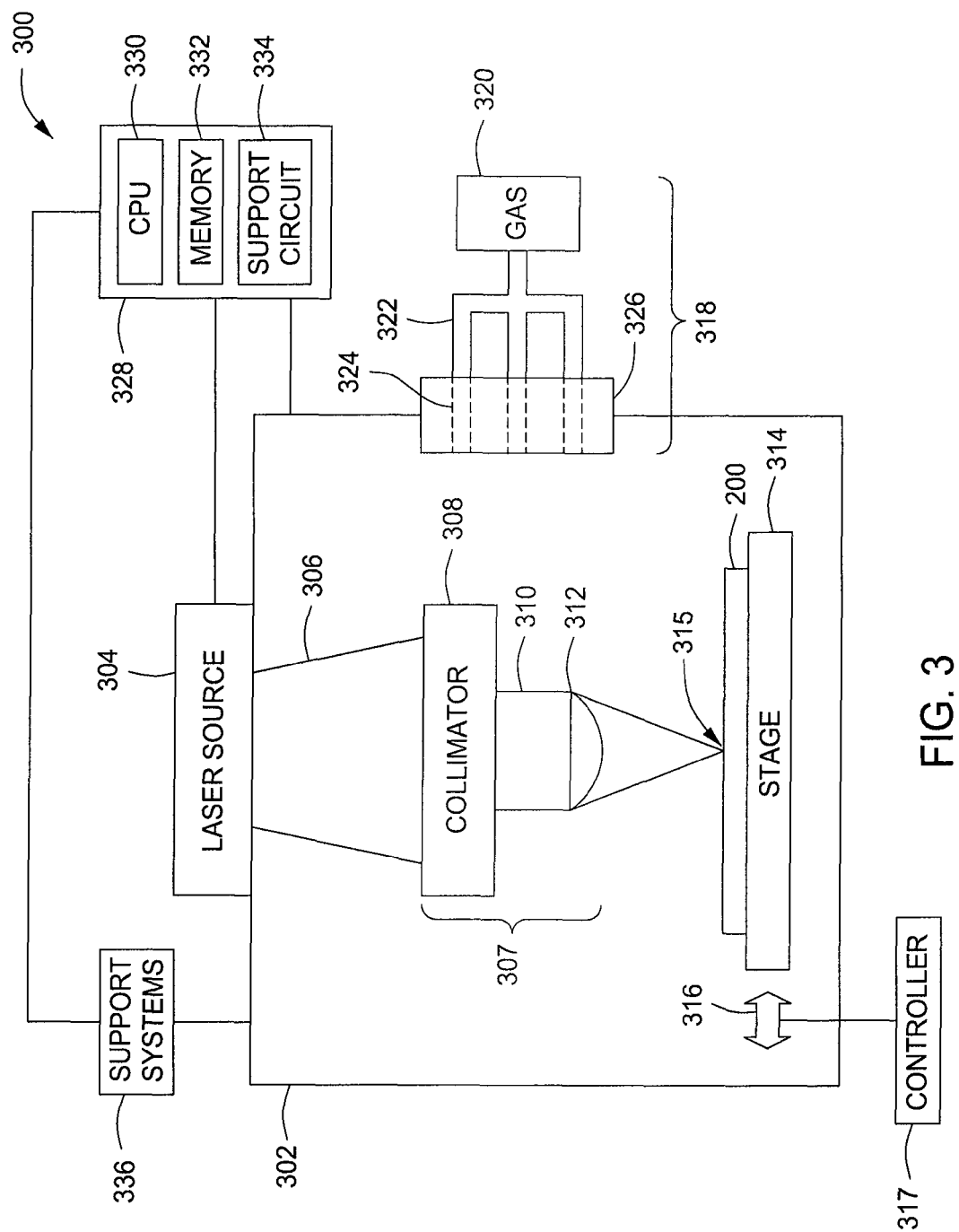
FIG. 3 depict a schematic, cross-sectional view of a laser annealing process chamber suitable for performing portions of the present invention.

FIG. 3 depicts a laser annealing chamber 300 suitable for performing laser annealing processes of the present invention, such as described above. The laser annealing chamber 300 comprises a reaction chamber 302, a gas injector 318 used to introduce one or more gases into the reaction chamber 302, a laser source 304, a stage 314 configured to receive a substrate thereon, and a translation mechanism 316. In embodiments of the present invention, the laser source 304 comprises at least a continuous wave electromagnetic radiation source or a pulsed electromagnetic radiation source. Focusing optics 307 may be disposed between the laser source 304 and the stage 314. In some variants of the laser annealing process chamber 300, the laser source 304 and focusing optics 307 may be placed outside of the chamber where radiation passes into the chamber via a transparent window (not shown).

The laser source 304 may comprise multiple laser diodes, each of which produces substantially uniform and spatially coherent light at the same wavelength. The power of the laser diodes may range from 0.5 kW to 50 kW. Suitable laser diodes are made by Coherent Inc. of Santa Clara, Calif., Spectra-Physics of Mountain View, Calif.; or by Cutting Edge Optronics, Inc. of St. Charles, Mo.

The focusing optics 307 may comprise one or more collimators 308 to collimate radiation 306 from the laser source 304 into a substantially parallel beam 310. This collimated radiation 310 may then focused by at least one lens 312 into a line of radiation 315 at the surface of the substrate 200.

Lens 312 may be any suitable lens, or series of lenses, capable of focusing radiation into a line. Lens 312 may be a cylindrical lens. Alternatively, lens 312 may be one or more concave lenses, convex lenses, plane mirrors, concave mirrors, convex mirrors, refractive lenses, diffractive lenses, Fresnel lenses, gradient index lenses, or the like.

The stage 314 may be any platform or chuck capable of securely holding a substrate, such as the substrate 200, during translation, as explained below. The stage 314 may include a means for grasping the substrate, such as a frictional, gravitational, mechanical, or electrical system. Examples of suitable means for grasping include mechanical clamps, electrostatic or vacuum chucks, or the like.

The laser annealing process chamber 300 further comprises a translation mechanism 316 that may be configured to translate the stage 314 and the line of radiation 315 relative to one another. The translation mechanism 316 may be coupled to the stage 314 to move the stage 314 relative to the laser source 304 and/or the focusing optics 307. Alternatively, the translation mechanism 316 may be coupled to the laser source 304 and/or the focusing optics 307 to move the laser source 304 and/or the focusing optics 307 relative to the stage 314. In an alternative embodiment, the translation mechanism 316 may move both the laser source 304, and the stage 314. Any suitable translation mechanism may be used, such as a conveyor system, rack and pinion system, or the like.

The translation mechanism 316 may be coupled to a controller 317 to control the scan speed at which the stage 314 and the line of radiation 315 move relative to one another. In addition, translation of the stage 314 and the line of radiation 315 relative to one another may be along a path perpendicular to the line of radiation 315 and parallel to the surface of the substrate 200. In some embodiments, the translation mechanism 316 moves at a constant speed of approximately 2 cm/s for a 35 micron wide line. In some embodiments, the translation mechanism 316 may position the line of radiation 315 above a first portion of the substrate 200 for a desired time, and then move the line of radiation 315 to second portion of the substrate 200 and maintain the line of radiation 315 over the second portion for a desired time.

At least one gas injector 318 may be used to introduce or inject one or more gases into the reaction chamber 302. The gas injector 318 comprises at least one gas source 320 fluidly coupled via a gas distribution system 322 to one or more gas inlets 324 in a gas manifold 326. The one or more gas inlets 324 may be located at any suitable location within the reaction chamber 302. For example, gas may be injected at the side of the reaction chamber and flow across the surface of the substrate orthogonally to the direction of relative motion between the line of radiation and the surface of the substrate 200.

The processes of the laser annealing process chamber may be implemented using a controller. The controller 328 generally comprises a central processing unit (CPU) 330, a memory 332, and support circuits 334 and is coupled to and controls the laser annealing process chamber 300 and support systems 336, directly (as shown in FIG. 3) or, alternatively, via computers (or controllers) associated with the process chamber and/or the support systems 336.

The support systems 336 include components used to execute and monitor pre-determined processes (e.g., laser annealing the substrate 200) in the process chamber 300. Such components generally include various sub-systems. (e.g., gas panel(s), gas distribution conduits, vacuum and exhaust sub-systems, and the like) and devices (e.g., power supplies, process control instruments, and the like) of the process chamber 300. These components are well known to those skilled in the art and are omitted from the drawings for clarity.

The process chamber 300 shown and described with respect to FIG. 3 and other embodiments of laser annealing process chambers that may be used with the embodiments described herein are further described in commonly assigned U.S. Pat. No. 7,005,061, issued Feb. 28, 2006, to Jennings, et al., and entitled "Thermal Flux Process by Scanning," which is hereby incorporated by reference herein.

Figure 4:
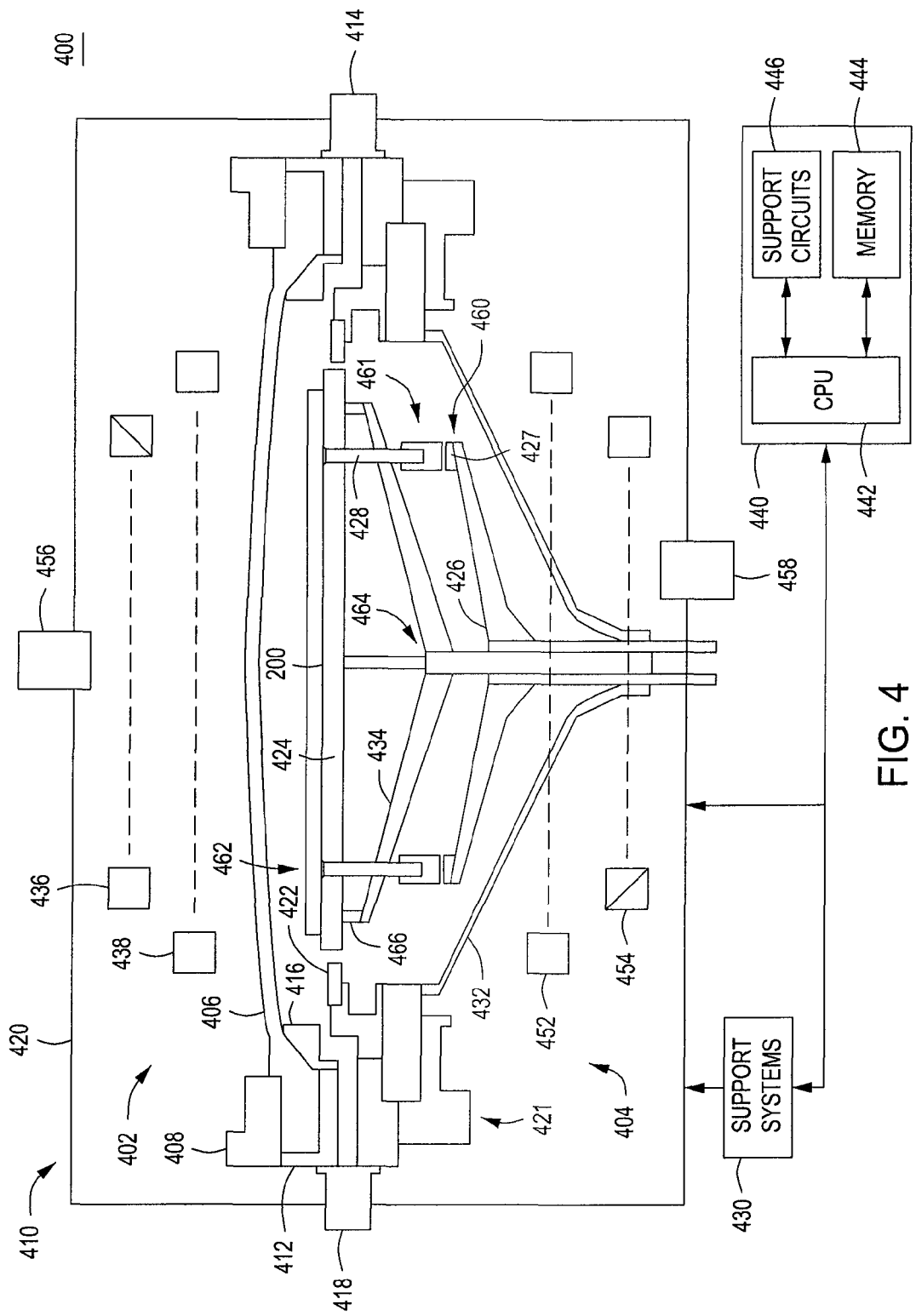
FIG. 4 depicts a schematic, cross-sectional view of a layer deposition process chamber suitable for performing portions of the present invention.

Upon treatment of the substrate 200 in the laser annealing process chamber, a layer may be deposited thereupon using any suitable deposition method discussed above in a process chamber suitable for said deposition method. FIG. 4 schematically depicts one such process chamber 400. The process chamber 400 may be adapted for performing epitaxial silicon deposition processes. In alternate configurations, the process chamber 400 may be adapted for performing at least one of deposition processes, such as thermal or plasma enhanced deposition, among other processes performed in the manufacture of integrated semiconductor devices and circuits. Specifically, such processes may include, but are not limited to, chemical vapor deposition (CVD) processes, physical vapor deposition (PVD) processes, and the like.

The process chamber 400 illustratively comprises a chamber body 410, support systems 430, and a controller 440. The chamber body 410 generally includes an upper portion 402, a lower portion 404, and an enclosure 420.

The upper portion 402 is disposed on the lower portion 404 and includes a lid 406, a clamp ring 408, a liner 416, a baseplate 412, one or more upper lamps 436 and one or more lower lamps 438, and an upper pyrometer 456. In one embodiment, the lid 406 has a dome-like form factor, however, lids having other form factors (e.g., flat or reverse-curve lids) are also contemplated. The lower portion 404 is coupled to a process gas intake port 414 and an exhaust port 418 and comprises a baseplate assembly 421, a lower dome 432, a substrate support 424, a pre-heat ring 422, a substrate lift assembly 460, a substrate support assembly 464, one or more upper lamps 452 and one or more lower lamps 454, and a lower pyrometer 458. Although the term "ring" is used to describe certain components of the process chamber, such as the pre-heat ring 422, it is contemplated that the shape of these components need not be circular and may include any shape, including but not limited to, rectangles, polygons, ovals, and the like.

During processing, the substrate 200 (post-treatment in the laser annealing process chamber) is disposed on the substrate support 424. The lamps 436, 438, 452, and 454 are sources of infrared (IR) radiation (i.e., heat) and, in operation, generate a pre-determined temperature distribution across the substrate 200. The lid 406, the clamp ring 416, and the lower dome 432 are formed from quartz; however, other IR-transparent and process compatible materials may also be used to form these components.

The substrate support assembly 464 generally includes a support bracket 434 having a plurality of support pins 466 coupled to the substrate support 424. The substrate lift assembly 160 comprises a substrate lift shaft 426 and a plurality of lift pin modules 461 selectively resting on respective pads 427 of the substrate lift shaft 426. In one embodiment, a lift pin module 461 comprises an optional upper portion of the lift pin 428 is movably disposed through a first opening 462 in the substrate support 424. In operation, the substrate lift shaft 426 is moved to engage the lift pins 428. When engaged, the lift pins 428 may raise the substrate 200 above the substrate support 424 or lower the substrate 200 onto the substrate support 424.

The support systems 430 include components used to execute and monitor pre-determined processes (e.g., growing epitaxial silicon films) in the process chamber 400. Such components generally include various sub-systems. (e.g., gas panel(s), gas distribution conduits, vacuum and exhaust subsystems, and the like) and devices (e.g., power supplies, process control instruments, and the like) of the process chamber 400. These components are well known to those skilled in the art and are omitted from the drawings for clarity.

The controller 440 generally comprises a central processing unit (CPU) 442, a memory 444, and support circuits 446 and is coupled to and controls the process chamber 400 and support systems 430, directly (as shown in FIG. 4) or, alternatively, via computers (or controllers) associated with the process chamber and/or the support systems.

Figure 5:
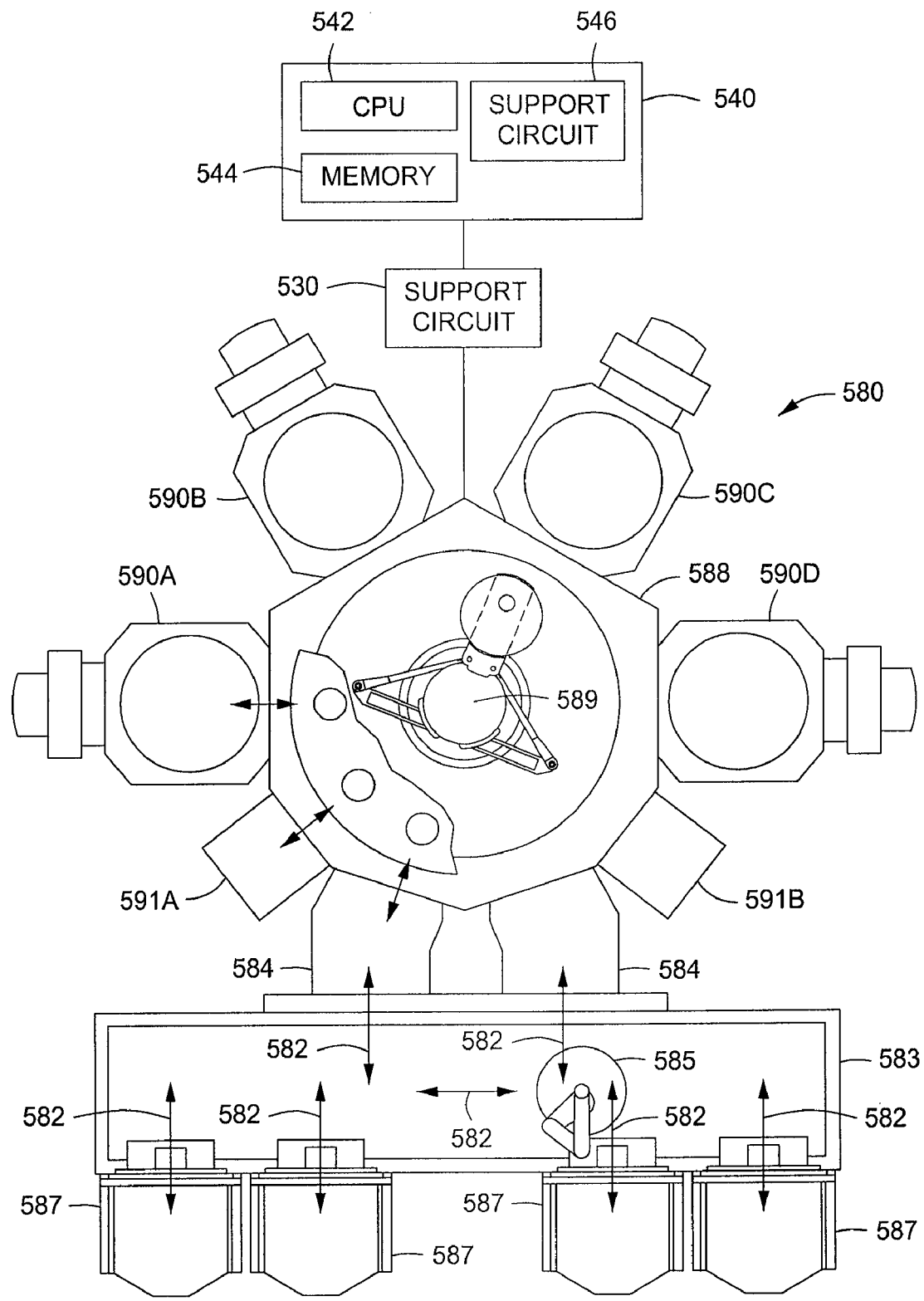
FIG. 5 depicts a cluster tool suitable for performing portions of the present invention.

FIG. 5 depicts a cluster tool suitable for performing portions of the present invention. Generally, the cluster tool is a modular system comprising multiple chambers which perform various functions including substrate center-finding and orientation, degassing, annealing, deposition and/or etching. In accordance with the embodiments of the present invention, the cluster tool may include a laser annealing process chamber and a layer deposition process chamber configured to perform the inventive laser annealing pre-treatment of the substrate 200, and the subsequent deposition of the layer 210, such as described in FIGS. 3 and 4, above. The multiple process chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. The details of one such staged-vacuum substrate processing system is disclosed in U.S. Pat. No. 5,186,718, entitled "Staged-Vacuum Substrate Processing System and Method," Tepman et al., issued on Feb. 16, 1993, which is incorporated herein by reference. However, the exact arrangement and combination of chambers may be altered for purposes of performing specific steps of a fabrication process, which includes the present laser anneal process (and optional subsequent epitaxial growth process).

By way of illustration, a particular cluster tool 580 is shown in a plan view in FIG. 5. The cluster tool 580 generally comprises a plurality of chambers and robots and is preferably equipped with a microprocessor controller 581 programmed to carry out the various processing methods performed in the cluster tool 580. A front-end environment 583 is shown positioned in selective communication with a pair of load lock chambers 584. A pod loader 585 disposed in the front-end environment 583 is capable of linear and rotational movement (arrows 582) to shuttle cassettes of substrates between the load locks 584 and a plurality of pods 587 which are mounted on the front-end environment 583. The load locks 584 provide a first vacuum interface between the front-end environment 583 and a transfer chamber 588. Two load locks 584 are provided to increase throughput by alternatively communicating with the transfer chamber 588 and the front-end environment 583. Thus, while one load lock 584 communicates with the transfer chamber 588, a second load lock 584 communicates with the front-end environment 583. A robot 589 is centrally disposed in the transfer chamber 588 to transfer substrates from the load locks 584 to one of the various processing chambers 590 and service chambers 591. The processing chambers 590 may perform any number of processes such as physical vapor deposition, chemical vapor deposition, and etching while the service chambers 591 are adapted for degassing, orientation, cooldown and the like.

In embodiments of the present invention, at least one of the processing chambers 590 is configured as laser annealing process chamber, such as chamber 300, illustrated in FIG. 3; and at least one is configured as layer deposition process chamber, such as chamber 400, illustrated in FIG. 4. The laser annealing process chamber and the layer deposition process chamber are used to practice embodiments of the present invention. The inclusion of both chambers on cluster tool 580 may allow that the substrate 200 remains free of contamination after cleaning in the laser annealing chamber and prior to layer deposition in the layer deposition chamber.

Optionally, the processing chambers 590C and 590D may be configured for plasma etching, wet chemical etching, ion implantation, wet chemical cleaning, or the like. Accordingly, the substrate 200 may be initially processed by the said methods above, and then transported by the robot 589 to the laser annealing process chamber, followed by the layer deposition process chamber.

One of the chambers 590 or 591 may be an inspection chamber in which the topography and surface composition of substrates may be measured. For example, an inspection chamber 591A may include a micro-Auger or energy dispersive X-ray. Substrates may be placed in the inspection chamber 591A, surface inspected to generate a substrate map before and/or after processing in the laser annealing chamber. The substrate map may be used as input to determine the cleanliness of the substrate and/or to determine where laser annealing is required. In some embodiments, if the target setpoint for cleanliness is not met, the substrate 200 may be returned to the laser annealing chamber for further processing.

The controller 540 generally comprises a central processing unit (CPU) 542, a memory 544, and support circuits 546 and is coupled to and controls the cluster tool 580 and support systems 530, directly (as shown in FIG. 5) or, alternatively, via computers (or controllers) associated with the process chamber and/or the support systems.

The controller 540 may contain a computer-readable medium for performing the methods described above in accordance with the embodiments of the invention. When the computer-readable medium is applied, the controller 540 issues instructions to perform the inventive methods to the process chambers 590 directly, or alternatively, via computers (or controllers) associated with the process chambers 590 and/or their support systems. Alternatively, the computer-readable medium for performing the methods of the invention may be contained on the controllers associated with the process chambers 590.

Thus, embodiments of methods for preparing the surface of a substrate prior to the deposition of an epitaxial layer have been provided herein. The inventive methods advantageously remove contaminants and heal defects on and/or near the substrate surface, while limiting the diffusion of existing dopants in the substrate. The inventive methods advantageously reduce the thermal budget required by providing targeted energy from a laser beam at high temperatures for short times to remove contaminants and heal defects on the substrate, thus providing similar benefit of a bulk substrate heating without undesired diffusion of dopant materials.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
providing a substrate having at least one of a defect or a contaminant disposed on or near a surface of the substrate; and
selectively annealing the substrate with a laser beam in the presence of a process gas comprising hydrogen.

2. The method of claim 1, further comprising:
depositing a layer of material atop the annealed substrate.

3. The method of claim 1, wherein the laser beam has a wavelength ranging from about 150 to about 1100 nanometers.

4. The method of claim 1, wherein the selective annealing at least a portion of the substrate further comprises:
moving the position of the laser beam over the substrate.

5. The method of claim 4, wherein the laser beam is moved at a rate of between about 10 to about 100 millimeters/second.

6. The method of claim 1, wherein the selective annealing at least a portion of the substrate further comprises:
annealing a first portion of the substrate for a first period of time;
moving the position of the laser beam relative to the substrate; and
annealing a second portion of the substrate for a second period of time.

7. The method of claim 6, wherein the laser beam anneals each of the first and second portions of the substrate for a time ranging from between about 1 to about 10,000 milliseconds.

8. The method of claim 1, wherein the substrate is selectively annealed to a depth of up to about 50 Angstroms.

9. The method of claim 1, wherein the selective annealing is performed at a temperature between about 700 to about 1000 degrees Celsius.

10. The method of claim 1, wherein the laser beam is pulsed.

11. The method of claim 10, wherein the laser beam is pulsed at a frequency of between about 1 Hz and about 100 Hz, with pulse durations ranging from 100 femtoseconds to 100 nanoseconds.

12. The method of claim 1, wherein the substrate has a contaminant including at least one of oxygen, carbon, hydrocarbons, water, or halides.

13. The method of claim 1, wherein the substrate has a defect including at least one of a lattice defect, a crack, or surface roughness of greater than about 10 Å RMS.

14. The method of claim 1, wherein the selective annealing is performed at a pressure of between about 1 to about 700 Torr.

15. The method of claim 1, wherein the process gas further comprises an inert gas.

16. A computer readable medium having instructions stored thereon that, when executed by a processor, causes a semiconductor process tool to perform a method of treating the surface of a substrate, comprising:
selectively annealing a substrate with a laser beam in the presence of a process gas comprising hydrogen, the substrate having at least one of a defect or a contaminant disposed on or near a surface of the substrate.

17. The computer readable medium of claim 16, wherein the selective annealing further comprises moving the position of the laser beam relative to the substrate.

18. The computer readable medium of claim 16, wherein the selective annealing further comprises:
annealing a first portion of the substrate for a first period of time;
moving the position of the laser beam relative to the substrate; and
annealing a second portion of the substrate for a second period of time.

19. The computer readable medium of claim 16, wherein the substrate is selectively annealed to a depth of up to about 50 Angstroms.

20. The computer readable medium of claim 16, wherein the laser beam is pulsed at a frequency of between about 1 Hz and about 100 Hz.

21. The computer readable medium of claim 16, further comprising:
depositing a layer of material atop the annealed substrate.

22. The computer readable medium of claim 21, wherein the layer of material is deposited by epitaxial growth, chemical vapor deposition, or physical vapor deposition.

23. An apparatus for processing a semiconductor substrate comprising:
a vacuum transfer chamber having one or more substrate transfer robots disposed therein;
a laser annealing chamber coupled to the vacuum transfer chamber, the laser annealing chamber having a gas inlet configured to receive a process gas comprising hydrogen;
a deposition chamber coupled to the vacuum transfer chamber;
a load lock chamber coupled to the vacuum transfer chamber; and
a controller for controlling operation of the apparatus, wherein the controller includes a computer readable medium having instructions stored thereon that, when executed, causes the apparatus to perform a method, comprising:

selectively annealing a substrate with a laser beam in the presence of a process gas comprising hydrogen, the substrate having at least one of a defect or a contaminant disposed on or near a surface of the substrate.

24. The apparatus of claim 23, wherein the selective annealing further comprises:

annealing a first portion of the substrate for a first period of time;

moving the position of the laser beam relative to the substrate; and annealing a second portion of the substrate for a second period of time.

* * * * *